(12) United States Patent
Yang et al.

(10) Patent No.: US 9,523,896 B2
(45) Date of Patent: Dec. 20, 2016

(54) BORDER MASKING STRUCTURES FOR LIQUID CRYSTAL DISPLAYS

(71) Applicant: Apple Inc., Cupertino, CA (US)

(72) Inventors: Byung Duk Yang, Cupertino, CA (US); Kwang Soon Park, Cupertino, CA (US); Kyung-Wook Kim, Cupertino, CA (US); Shih Chang Chang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 197 days.

(21) Appl. No.: 14/493,151

(22) Filed: Sep. 22, 2014

(65) Prior Publication Data

US 2015/0286106 A1 Oct. 8, 2015

Related U.S. Application Data

(60) Provisional application No. 61/974,945, filed on Apr. 3, 2014.

(51) Int. Cl.
| | |
|---|---|
| *G02F 1/136* | (2006.01) |
| *G02F 1/1335* | (2006.01) |
| *G02F 1/1333* | (2006.01) |
| *G02F 1/1362* | (2006.01) |
| *H01L 27/12* | (2006.01) |
| *G02F 1/1339* | (2006.01) |

(52) U.S. Cl.
CPC ....... *G02F 1/136209* (2013.01); *G02F 1/1339* (2013.01); *G02F 1/133512* (2013.01); *H01L 27/1218* (2013.01); *H01L 27/1248* (2013.01); *H01L 27/1292* (2013.01); *G02F 2001/133388* (2013.01)

(58) Field of Classification Search
CPC .............. G02F 1/1368; G02F 1/133707; G02F 1/13394; G02F 1/136227; G02F 2001/13398; G02F 1/1337; G02F 1/1339
See application file for complete search history.

(56) References Cited

U.S. PATENT DOCUMENTS 7,433,010 B2 * 10/2008 Lim ...................... G02F 1/1339
   349/110
7,679,708 B2 * 3/2010 Momose ............... G02F 1/1339
   349/153

(Continued)

FOREIGN PATENT DOCUMENTS

JP 2009145442 7/2009

*Primary Examiner* — Huyen Ngo
(74) *Attorney, Agent, or Firm* — Treyz Law Group, P.C.; Jason Tsai; Joseph F. Guihan

(57) ABSTRACT

A display may have a thin-film transistor (TFT) layer and color filter layer. Light blocking structures in an inactive area of the display may prevent stray backlight from leaking out of the display. The thin-film transistor layer may have a first substrate, a first black masking layer, a planarization layer, and a layer of TFT circuitry on the planarization layer. The color filter layer may have a second substrate and a second black masking layer on the second substrate. Light-cured sealant may be formed between the TFT layer and the color filter layer. Gaps may be formed in the second black masking layer to allow light to cure the sealant. At least a portion of the TFT circuitry may serve to block stray backlight penetrating through the gaps in the second black masking layer during normal operation of the display.

19 Claims, 10 Drawing Sheets

(56) References Cited

U.S. PATENT DOCUMENTS

| | | |
|---|---|---|
| 7,746,428 B2 | 6/2010 | Kobayashi et al. |
| 7,898,633 B2 | 3/2011 | Ishii et al. |
| 2002/0167634 A1 | 11/2002 | Watanabe et al. |
| 2007/0195029 A1 | 8/2007 | Jeon et al. |
| 2007/0263159 A1 | 11/2007 | Kobayashi et al. |
| 2007/0273821 A1 | 11/2007 | Liou et al. |
| 2009/0303427 A1 | 12/2009 | Kondo et al. |
| 2010/0253638 A1 | 10/2010 | Yousefpor et al. |
| 2011/0181808 A1 | 7/2011 | Kobayashi et al. |
| 2013/0154949 A1 | 6/2013 | Roudbari et al. |
| 2013/0329460 A1* | 12/2013 | Mathew .................. H05K 5/02 362/612 |

* cited by examiner

BORDER MASKING STRUCTURES FOR LIQUID CRYSTAL DISPLAYS

This application claims the benefit of provisional patent application No. 61/974,945 filed Apr. 3, 2014, which is hereby incorporated by reference herein in its entirety.

BACKGROUND

This relates generally to electronic devices and, more particularly, to electronic devices with displays.

Electronic devices often include displays. For example, cellular telephones, computers, and televisions have displays.

A display such as a liquid crystal display has an active area filled with an array of display pixels. The active area is surrounded by an inactive border area. It may be desirable to minimize or eliminate the use of unsightly bezel structures in the inactive border area. In displays with small bezels or no bezels, there is a risk that backlight can leak through the inactive border area. If care is not taken, stray backlight will undesirably lighten the inactive border area.

It would therefore be desirable to be able to provide improved light blocking structures for inactive border regions in displays such as liquid crystal displays.

SUMMARY

An electronic device may be provided with a display such as a liquid crystal display. The liquid crystal display may have an upper polarizer and a lower polarizer. A layer of liquid crystal material may be interposed between a thin-film transistor layer and a color filter layer. The thin-film transistor layer may be interposed between the liquid crystal layer and the upper polarizer. The color filter layer may be interposed between the liquid crystal layer and the lower polarizer.

The thin-film transistor layer and color filter layer may have an associated array of display pixels that define an active area for the display. The display pixels of the active area may be used to display images for a user. An inactive border area in the display may run along the periphery of the active area. Light blocking structures in the inactive area may prevent stray backlight from a backlight light guide plate from leaking out of the display.

The thin-film transistor (TFT) layer may include a clear TFT substrate, a TFT black masking layer formed on the clear TFT substrate, a planarization layer formed over the TFT black masking layer, and TFT structures formed over the planarization layer. The color filter (CF) layer may include a clear CF substrate and a CF black masking layer formed on the clear CF substrate.

At least one ring of adhesive material can be formed between the thin-film transistor layer and the color filter layer to seal the liquid crystal material within the two layers in the display. The ring of adhesive may be cured using ultraviolet light (as an example) that is transmitted through at least two or more gaps in the color filter black masking layer.

To prevent light leakage in the inactive border area during normal operation of the display, the TFT structures formed over the planarization layer in the TFT layer may include opaque conductive routing members each of which serves to prevent any stray light from the backlight unit that penetrates through the gaps in the CF black masking layer from reaching the TFT black masking layer (e.g., at least some of the TFT routing members are formed directly over and completely overlap and cover the respective gaps in the color filter black masking layer). Configured in this way, the thickness of the thin-film transistor black masking layer can be minimized, and no additional light blocking material such as black tape needs to be formed on the backside of the color filter substrate.

Further features of the present invention, its nature and various advantages will be more apparent from the accompanying drawings and the following detailed description.

DETAILED DESCRIPTION

Illustrative electronic devices of the types that may be provided with displays are shown in FIGS. 1, 2, 3, and 4.

Figure 1:
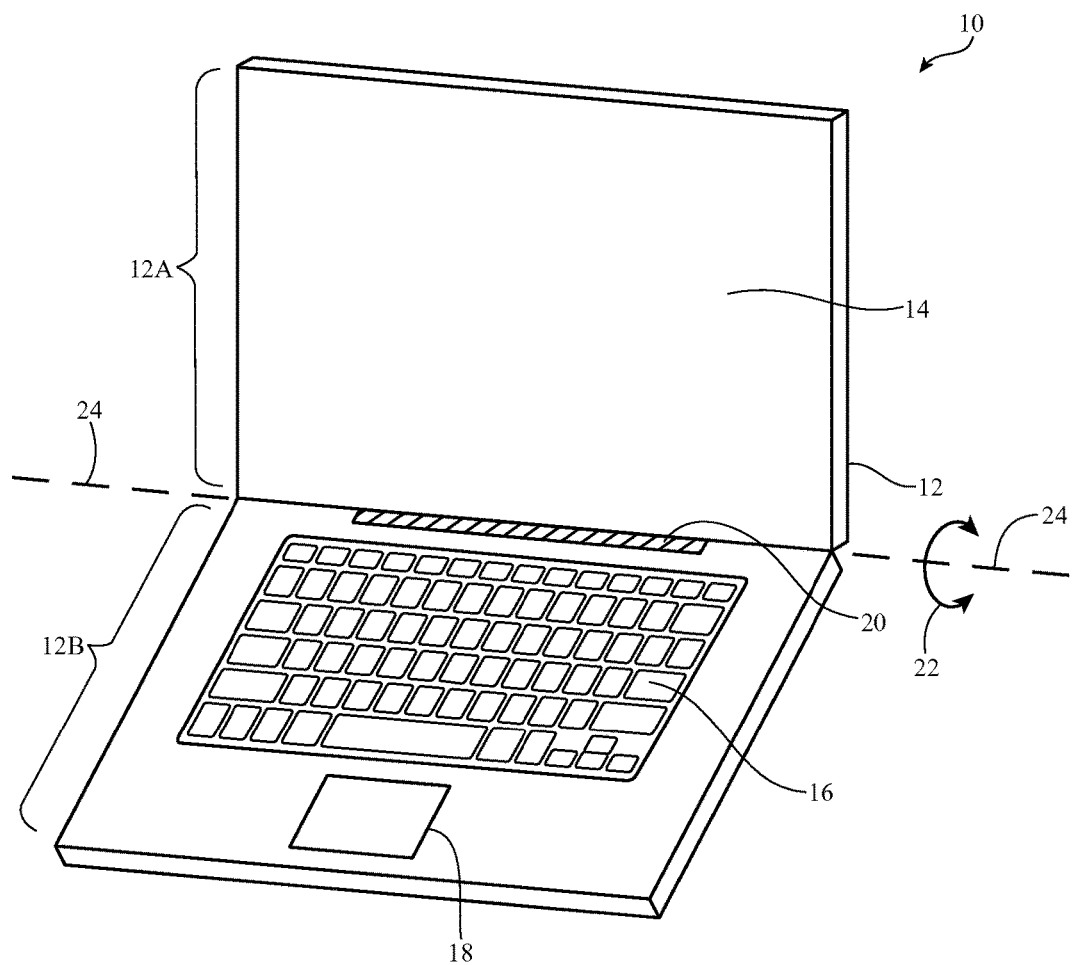
FIG. 1 is a perspective view of an illustrative electronic device such as a laptop computer with a display in accordance with an embodiment.

Electronic device 10 of FIG. 1 has the shape of a laptop computer and has upper housing 12A and lower housing 12B with components such as keyboard 16 and touchpad 18. Device 10 has hinge structures 20 (sometimes referred to as a clutch barrel) to allow upper housing 12A to rotate in directions 22 about rotational axis 24 relative to lower housing 12B. Display 14 is mounted in housing 12A. Upper housing 12A, which may sometimes be referred to as a display housing or lid, is placed in a closed position by rotating upper housing 12A towards lower housing 12B about rotational axis 24.

Figure 2:
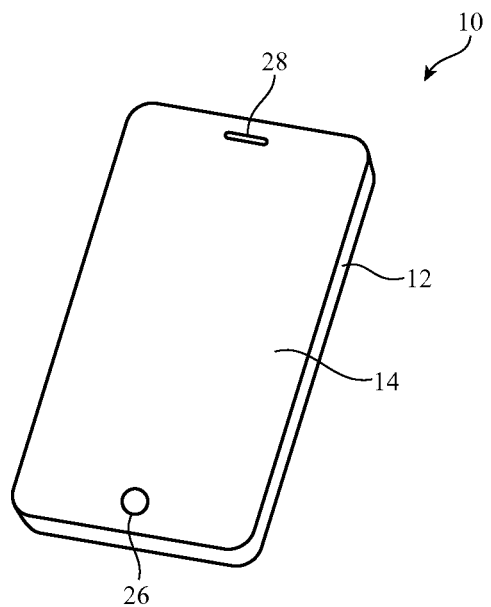
FIG. 2 is a perspective view of an illustrative electronic device such as a handheld electronic device with a display in accordance with an embodiment.

FIG. 2 shows an illustrative configuration for electronic device 10 based on a handheld device such as a cellular telephone, music player, gaming device, navigation unit, or other compact device. In this type of configuration for device 10, housing 12 has opposing front and rear surfaces. Display 14 is mounted on a front face of housing 12. Display 14 may have an exterior layer that includes openings for components such as button 26 and speaker port 28. Device 10 may, if desired, be a compact device such as a wrist-mounted device or pendant device (as examples).

Figure 3:
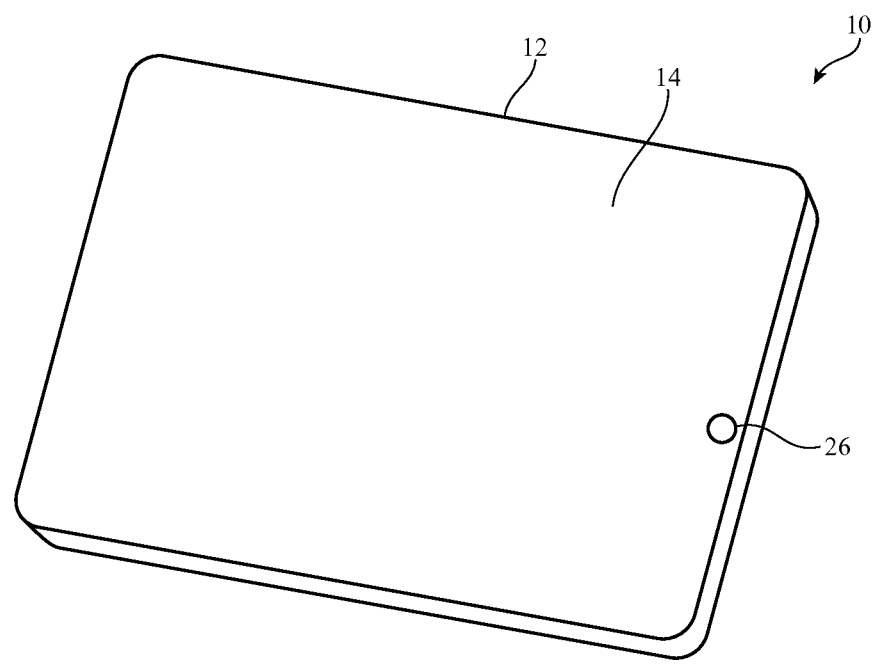
FIG. 3 is a perspective view of an illustrative electronic device such as a tablet computer with a display in accordance with an embodiment.

In the example of FIG. 3, electronic device 10 is a tablet computer. In electronic device 10 of FIG. 3, housing 12 has opposing planar front and rear surfaces. Display 14 is mounted on the front surface of housing 12. As shown in FIG. 3, display 14 has an opening to accommodate button 26.

Figure 4:
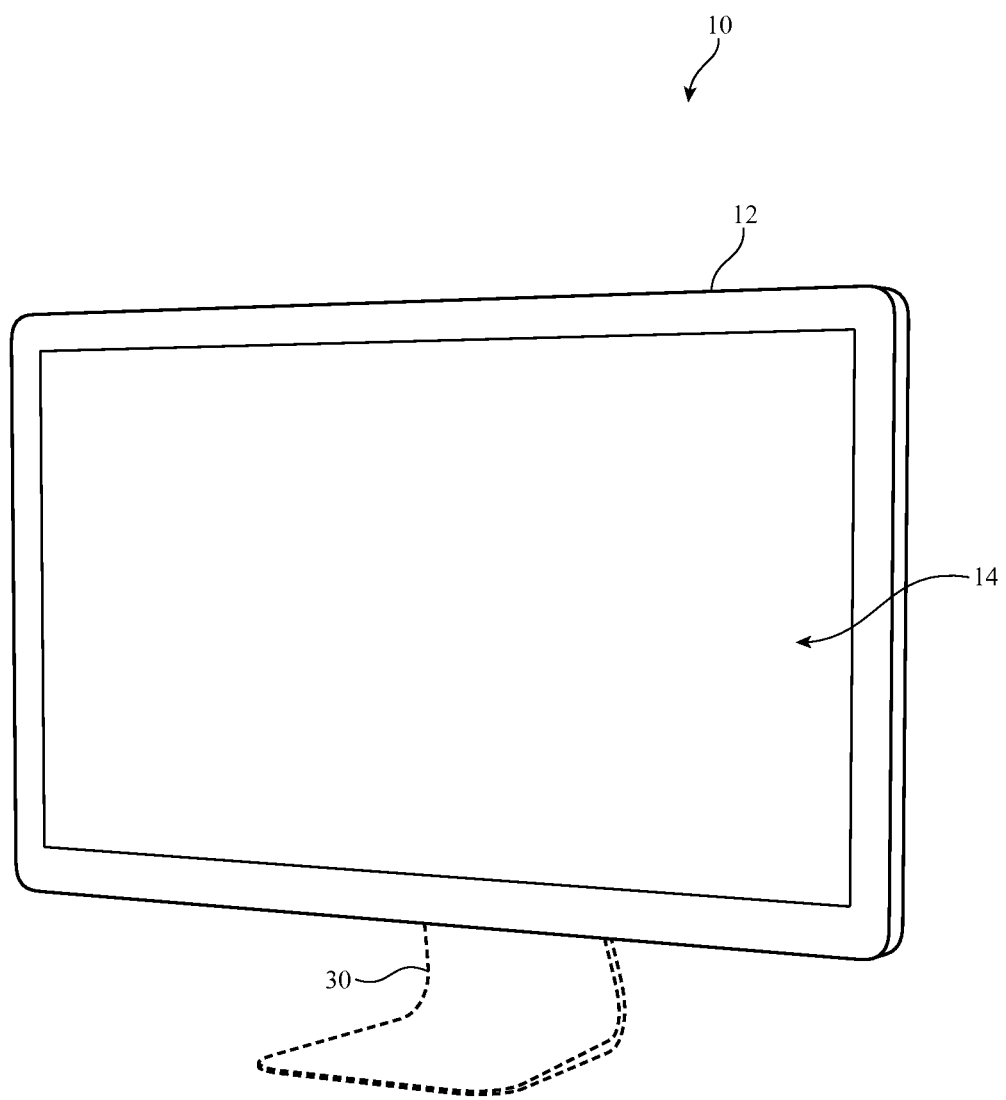
FIG. 4 is a perspective view of an illustrative electronic device such as a display for a computer or television with a display in accordance with an embodiment.

FIG. 4 shows an illustrative configuration for electronic device 10 in which device 10 is a computer display, a computer that has an integrated computer display, or a television. Display 14 is mounted on a front face of housing 12. With this type of arrangement, housing 12 for device 10 may be mounted on a wall or may have an optional structure such as support stand 30 to support device 10 on a flat surface such as a table or desk.

Figure 5:
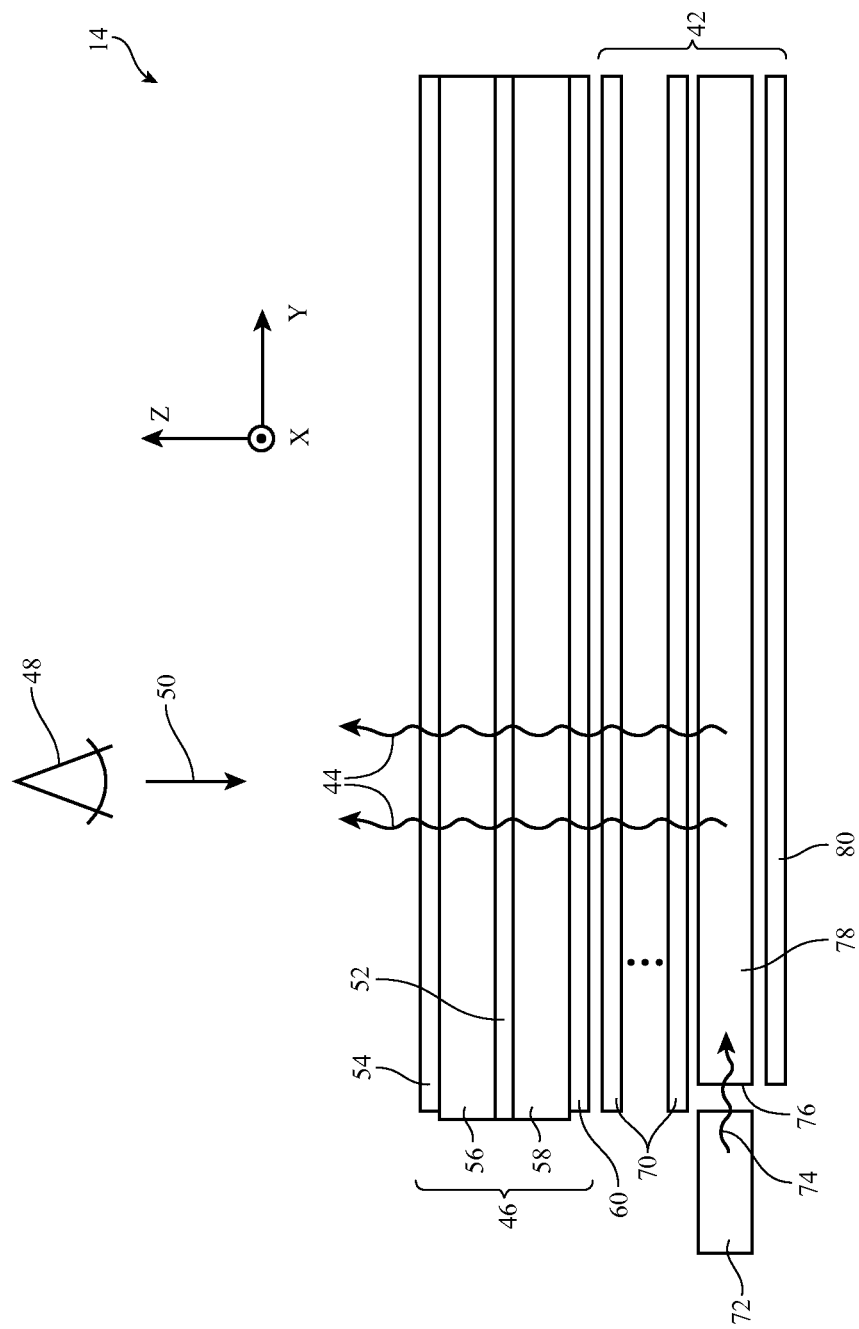
FIG. 5 is a cross-sectional side view of an illustrative display in accordance with an embodiment.

Display 14 may be a liquid crystal display or a display formed using other suitable display technologies. A cross-sectional side view of an illustrative configuration for display 14 of device 10 (e.g., a liquid crystal display for the devices of FIG. 1. FIG. 2, FIG. 3. FIG. 4 or other suitable electronic devices) is shown in FIG. 5. As shown in FIG. 5, display 14 may include backlight structures such as backlight unit 42 for producing backlight 44. During operation, backlight 44 travels outwards (vertically upwards in dimension Z in the orientation of FIG. 5) and passes through display pixel structures in display layers 46. This illuminates any images that are being produced by the display pixels for viewing by a user. For example, backlight 44 may illuminate images on display layers 46 that are being viewed by viewer 48 in direction 50.

Display layers 46 may be mounted in chassis structures such as a plastic chassis structure and/or a metal chassis structure to form a display module for mounting in housing 12 or display layers 46 may be mounted directly in housing 12 (e.g., by stacking display layers 46 into a recessed portion of housing 12).

Display layers 46 may include a liquid crystal layer such a liquid crystal layer 52. Liquid crystal layer 52 may be sandwiched between display layers such as display layers 58 and 56. Layers 56 and 58 may be interposed between lower (innermost) polarizer layer 60 and upper (outermost) polarizer layer 54.

Layers 58 and 56 may be formed from transparent substrate layers such as clear layers of glass or plastic. Layers 56 and 58 may be layers such as a thin-film transistor layer and/or a color filter layer. Conductive traces, color filter elements, transistors, and other circuits and structures may be formed on the substrates of layers 58 and 56 (e.g., to form a thin-film transistor layer and/or a color filter layer). Touch sensor electrodes may also be incorporated into layers such as layers 58 and 56 and/or touch sensor electrodes may be formed on other substrates.

With one illustrative configuration, outer substrate layer 56 may be a thin-film transistor layer that includes an array of thin-film transistors and associated electrodes (display pixel electrodes) for applying electric fields to liquid crystal layer 52 and thereby displaying images on display 14. Inner substrate layer 58 may be a color filter layer that includes an array of color filter elements for providing display 14 with the ability to display color images.

Backlight structures 42 may include a light guide plate such as light guide plate 78. Light guide plate 78 may be formed from a transparent material such as clear glass or plastic. During operation of backlight structures 42, a light source such as light source 72 may generate light 74. Light source 72 may be, for example, an array of light-emitting diodes.

Light 74 from light source 72 may be coupled into edge surface 76 of light guide plate 78 and may be distributed in dimensions X and Y throughout light guide plate 78 due to the principal of total internal reflection. Light guide plate 78 may include light-scattering features such as pits or bumps. The light-scattering features may be located on an upper surface and/or on an opposing lower surface of light guide plate 78.

Light 74 that scatters upwards in direction Z from light guide plate 78 may serve as backlight 44 for display 14. Light 74 that scatters downwards may be reflected back in the upwards direction by reflector 80. Reflector 80 may be formed from a reflective material such as a layer of white plastic or other shiny materials.

To enhance backlight performance for backlight structures 42, backlight structures 42 may include optical films 70. Optical films 70 may include diffuser layers for helping to homogenize backlight 44 and thereby reduce hotspots, compensation films for enhancing off-axis viewing, and brightness enhancement films (also sometimes referred to as turning films) for collimating backlight 44. Optical films 70 may overlap the other structures in backlight unit 42 such as light guide plate 78 and reflector 80. For example, if light guide plate 78 has a rectangular footprint in the X-Y plane of FIG. 5, optical films 70 and reflector 80 may have a matching rectangular footprint.

Display 14 may have an array of display pixels (e.g., a rectangular array having rows and columns) for displaying images to a viewer. Vertical signal lines called data lines may be used to carry display data to respective columns of display pixels. Horizontal signal lines called gate lines may be used to carry gate line signals (sometimes referred to as gate control signals or gate signals) to respective rows of display pixels. The outline of the array of display pixels in display 14 defines an active area for display 14. The active area may have a rectangular shape and may be surrounded by an inactive border region. An inactive border area may, for example, run along one edge, two edges, three edges, or all four edges of the active area.

Figure 6:
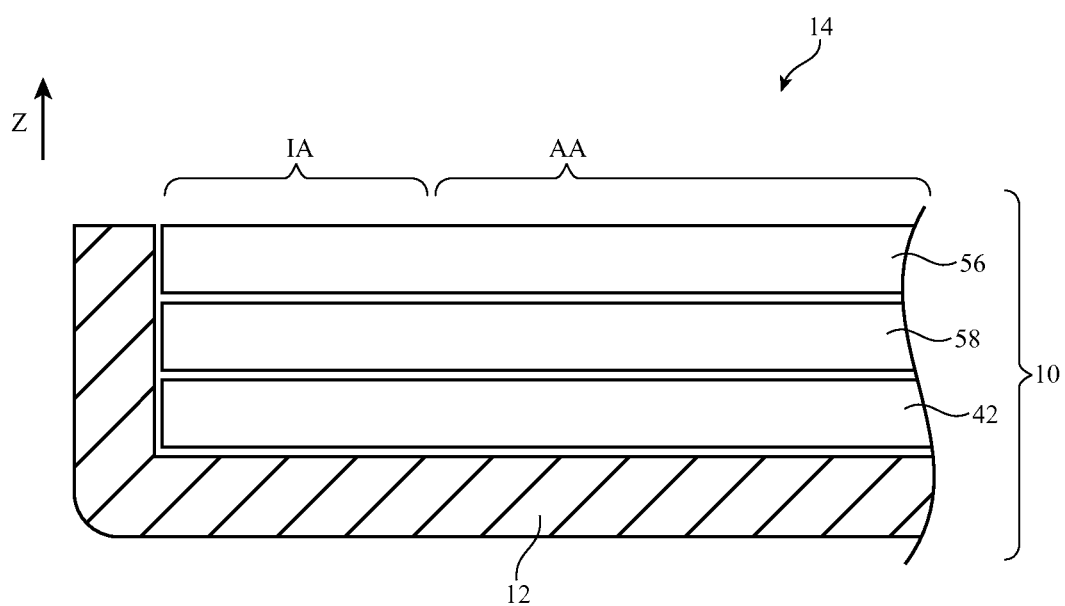
FIG. 6 is a cross-sectional side view of a portion of an illustrative electronic device showing how an edge of a display in the device may be free of overlapping housing structures in accordance with an embodiment.

A cross-sectional side view of an illustrative electronic device having a display such as display 14 of FIG. 5 is shown in FIG. 6. As shown in FIG. 6, images may be displayed on central active area AA of display 14. Inactive area IA may have a rectangular ring shape that runs around the rectangular periphery of active area AA. To avoid unsightly bezel structures in device 10, it may be desirable to keep inactive area IA free of overlapping housing structures, bezels, or other potentially unattractive border structures.

To avoid light leakage in inactive area IA (e.g., to prevent stray light from escaping in the absence of a bezel or other overlapping structure), display 14 may be provided with border masking structures in inactive area IA. The border masking structures may help block stray backlight from backlight unit 42 and thereby ensure that border IA does not allow excess light to escape. Backlight from backlight unit 42 will therefore be confined to active area AA.

To provide satisfactory light blocking capabilities in inactive area IA, light blocking structures can be formed in at least two parts (e.g., two layers). A first part of the light blocking structures may be formed from a black masking layer on the underside of thin-film transistor layer 56. In active area AA, the black masking layer may be patterned to form a black mask. The black mask is a grid-shaped series of intersecting black lines that define a rectangular array of clear display pixel openings in the thin-film transistor layer. Each of the openings in the black mask is aligned with a respective color filter element in a corresponding array of color filter elements on color filter layer 58. The grid-shaped black mask on the thin-film transistor layer may sometimes be referred to as a "black matrix." In inactive area IA, the black mask may form the first part of the light blocking structures. The second part of the light blocking structures may be formed from another black masking layer on the color filter layer 58.

Figure 7:
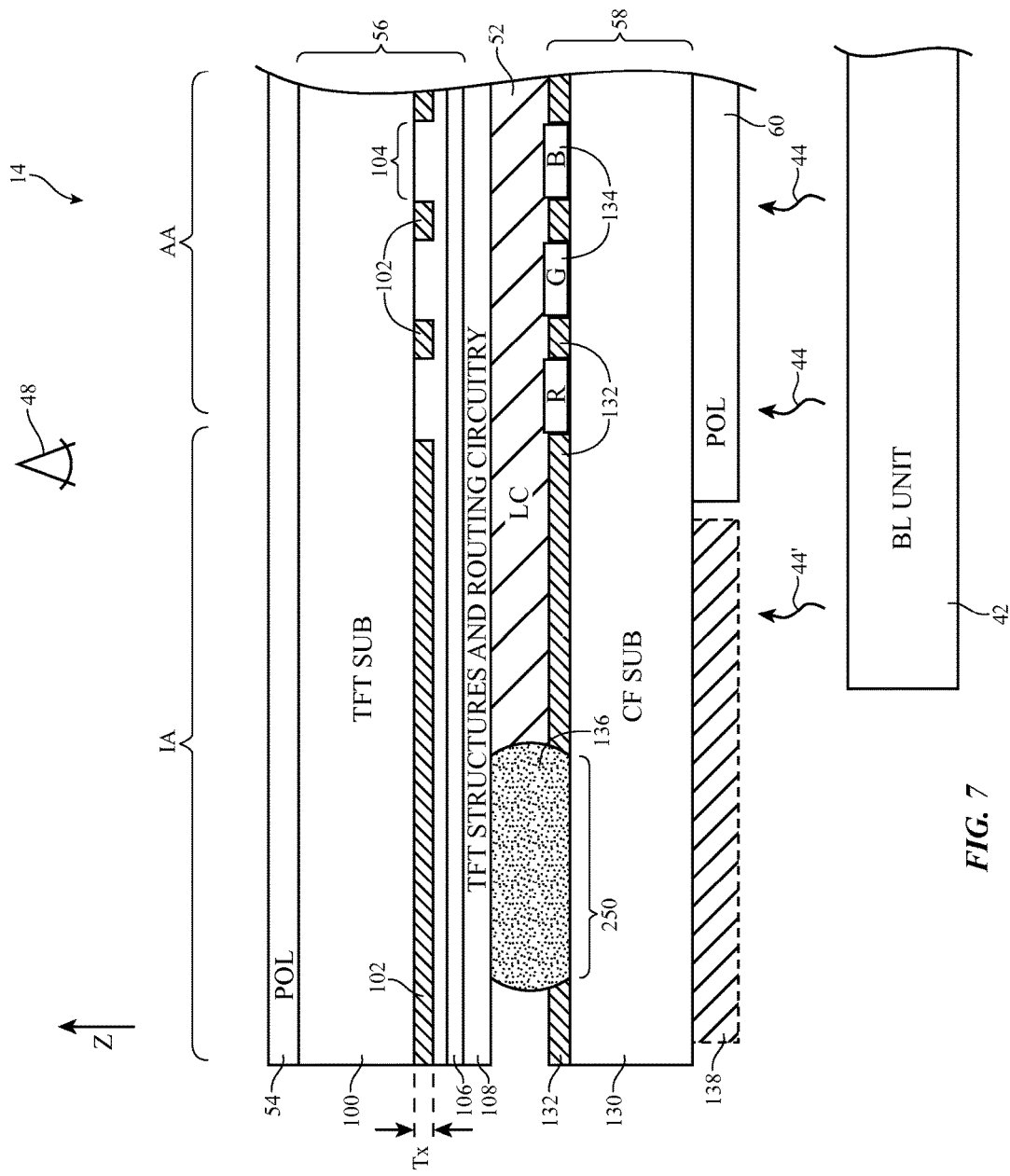
FIG. 7 is a cross-sectional side view of an illustrative display having light blocking structures in accordance with an embodiment.

FIG. 7 is a more detailed cross-sectional side view of display 14. As shown in FIG. 7, display 14 may have an active area AA (e.g., a central rectangular active area filled with display pixels) and may have an inactive area IA that runs along the periphery of active area AA. Thin-film transistor layer 56 is located above color filter layer 58. Thin-film transistor layer 56 may include a thin-film transistor (TFT) substrate 100, a black masking layer 102, a planarization layer 106, and thin-film transistor circuitry such as thin-film transistor circuitry layer 108. Substrate 100 may be formed from a clear planar structure such as a sheet of transparent plastic, transparent glass, or other clear substrate layer. Black masking (BM) layer 102 may be patterned to form a black matrix in active area AA of display 14 and may be patterned to form part of a light-blocking black mask border in inactive area IA. Black masking layer 102 formed on TFT substrate 100 is sometimes referred to as a thin-film transistor black masking layer (i.e., a TFT BM layer) or a TFT opaque masking layer. Black masking layer 102 may be patterned to form display pixel openings such as openings 104 that are aligned with corresponding color filter elements 134 in the color filter layer 58.

Black masking material 102 may be formed from a photoimageable material such as black photoresist. The black photoresist may be formed from a polymer such as polyimide. To withstand the elevated temperatures involved in subsequent thin-film transistor fabrication steps, the polymer that is used in forming TFT black masking material 102 preferably can withstand elevated temperatures (e.g., temperatures of 350° C. or higher or other suitable elevated temperatures). Opaque filler materials such as carbon black and/or titanium black may be incorporated into the polyimide or other polymer of layer 102, so that layer 102 is opaque and is able to block at least part of the stray light in inactive area IA.

Planarization layer 106 is used to planarize black masking layer 102 so that thin-film transistor structures can be formed on black masking layer 102. With one suitable arrangement, planarization layer 106 is formed from a black mask compatible material having a low dielectric constant such as a spin-on glass (SOG). For example, planarization layer 106 may be formed from a spin-on glass such as a silicon oxide based spin-on glass (e.g., a silicate spin-on glass). During thin-film transistor formation, the thin-film transistor structures and associated routing circuitry in layer 108 may be subjected to elevated processing temperatures (e.g., temperatures of 350° C. or higher). Polyimide black mask layer 102 and spin-on glass planarization layer 106 are preferably able to withstand processing at these elevated temperatures (i.e., spin-on glass layer 106 will not experience diminished transparency and polyimide layer 102 will not degrade).

It may be desirable to limit the amount of opaque filler in material 102, as too much opaque filler material may cause the resistivity of layer 102 to drop to an undesirably low level, potentially interfering with satisfactory operation of the thin-film transistor circuitry formed on thin-film transistor layer 56. An adequate amount of resistivity for layer 102 can help ensure that electrostatic discharge (ESD) requirements for display 14 are met. When the amount of opaque filler is limited, the opacity of black mask layer 102 (i.e., the optical density of TFT BM layer 102) in inactive border IA will also be limited.

The thickness Tx of black masking layer 102 can be increased somewhat to increase optical density (opacity) for layer 102, but excessive thicknesses for black masking layer 102 should generally be avoided. If black masking layer 102 is too thick, it may be difficult to planarize black masking layer 102 satisfactorily. In addition, excessive thickness of the associated planarization layer 106 may create an undesired color cast in the active area of display 14 and/or may reduce light transmittance in the active area of display 14. Excessive thickness of layer 106 may also undesirably lower aperture ratio and degrade off-axis viewing capabilities. Excessive thickness values may also lead to cracking in layers 102 and/or 106 (e.g., cracks may develop due to imperfect matching between the coefficients of thermal expansion for the materials of layers 102 and 106).

In view of these constraints, it may be desirable to limit the thickness Tx of black mask layer 102 to a small value (e.g., about 1.5 microns, less than 2 microns, 1-2 microns, less than 3 microns, or other suitable value). The thickness of planarization layer 106 may then be limited to a comparably small thickness value. For example, the thickness of planarization layer 106 may be about 3 microns, less than 5 microns, 2-5 microns, less than 4 microns, less than 3 microns, or other suitable value).

In configurations for display 14 in which thickness Tx of black masking layer 102 is relatively small and in which the amount of opaque filler in layer 102 is limited, the black mask border formed from black masking layer 102 in inactive area IA may not be sufficiently opaque to serve as the exclusive light blocking structure for the border of display 14. Accordingly, one or more additional layers of light blocking structures may be formed in inactive area IA to supplement the masking function performed by black masking layer 102 (see, e.g., color filter black masking layer 132, black tape 138, etc.).

Still referring to FIG. 7, liquid crystal material 52 may be interposed between thin-film transistor layer 56 and color filter layer 58. Sealant 136 (e.g., a rectangular ring of epoxy or other adhesive that runs around the rectangular periphery of display 14) may be used to seal liquid crystal (LC) material 52 within display 14. The exemplary configuration of FIG. 7 in which only one ring of sealant 136 is formed between TFT layer 56 and the color filter (CF) layer 58 is merely illustrative. In other suitable arrangements, two or more rectangular rings of sealing material 136 may be formed around the periphery of display 14 to seal the liquid crystal material 52 within display 14.

Color filter layer 58 may have a transparent substrate such as substrate 130. Substrate 130 may be formed from a planar layer of clear glass, a transparent plastic layer, or other transparent substrate material. An array of color filter elements 134 (referred to collective as a color filter array or CFA) may be formed on the surface of substrate 130. Color filter elements 134 may include red color filter elements R, blue color filter elements B, and green color filter elements G. Color filter elements 134 may be formed from colored photoimageable polymers.

A layer of opaque masking material such as black photoimageable polymer layer 132 may form a black matrix in active area AA. The black matrix may have a grid shape with an array of rectangular openings. A respective color filter element 134 may be formed in each opening in the black matrix formed from opaque masking layer 132 on color filter substrate 130. Each color filter element 134 in the array of color filter elements on color filter layer 58 may be laterally aligned with a respective opening 104 in the array of openings in the black matrix formed from layer 102 on the inner surface of thin-film transistor substrate layer 100 (i.e., each display pixel in display 14 may have an opening 104, an associated display pixel electrode in layer 108, and an associated aligned color filter element 134 through which backlight 44 passes). Some of black masking layer 132 on substrate 130 may extend into inactive area IA and may help to block stray light 44' from backlight unit 42.

Backlight 44 from backlight unit 42 may pass through polarizer 60 and the other layers of display 14 to serve as backlight in active area AA. In inactive area IA, it is desirable to block stray backlight such as illustrative stray backlight ray 44'. This is accomplished using at least two light blocking structures in inactive area IA: the black border formed by black masking layer 102 on thin-film transistor layer 56 and the black border formed by black masking layer 132 on color filter layer 58.

As shown in FIG. 7, sealant 136 may be formed in an opening within the color filter black masking layer 132 (i.e., within an opening 250 of the CF BM layer). Opening 250 in layer 132 may be necessary to allow sealant material 136 to be cured during the TFT layer to CF layer sealing process, which is described in further detail in connection with FIGS. 8 and 9 below). Stray light 44' from unit 42 passing through opening 250 can reach TFT black masking layer 102. As described above, since black masking layer 102 should be formed with limited thickness Tx, stray light 44 reaching layer 102 in this way can undesirably lighten the inactive border area, which can be distracting from the point of view of user 48.

One way of mitigating the amount of light leakage through opening 250 is to form additional light blocking structures on the lower (outermost) surface of color filter layer substrate 130 (i.e., on the lower surface of color filter layer 58). In the example of FIG. 7, opaque tape such as black tape 138 may be laminated to the lower surface of color filter layer substrate 130 in inactive area IA. Black tape 138 may have an opaque carrier and an adhesive layer that serves to adhere the opaque carrier to CF layer substrate 130.

With one suitable arrangement, black tape 138 may have an optical density of about 5.7 (e.g., 4 or more, 5 or more, 4-7, or other suitable optical density), may have a total thickness of about 0.045 mm (e.g., 0.03-0.07 mm, more than 0.02 mm, less than 0.1 mm, etc.), and may be formed from a conductive fabric carrier coated with a layer of black conductive acrylic adhesive. Conductive tape may be used to provide radio-frequency interference shielding and/or electrical grounding in addition to serving as light shielding. Tape 138 may be die cut to form a desired shape (e.g., a rectangular ring), may be formed in elongated strips, or may be otherwise shaped into a desired configuration for serving as an additional light blocking layer for inactive area IA of display 14. Tape 138 may be applied manually and/or using computer-controlled tape dispensing equipment. Tape 138 formed in this way can help prevent stray light from reaching layer 102 through opening 250, thereby minimizing light leakage in inactive area IA.

Figure 8:
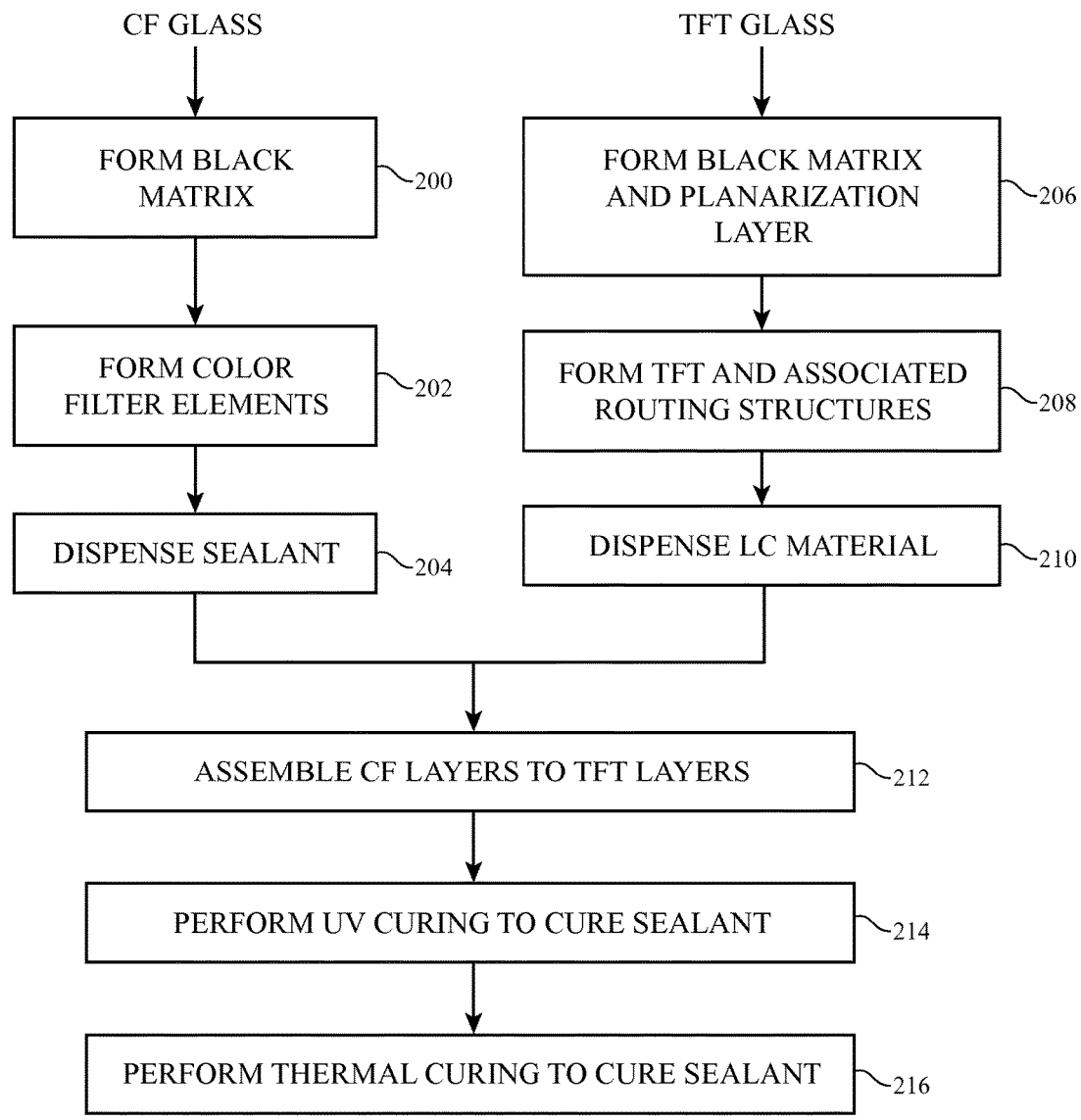
FIG. 8 is a flow chart of illustrative steps involved in manufacturing a display of the type shown in FIG. 7 in accordance with an embodiment.

Illustrative steps involved in forming a display such as display 14 of FIG. 7 are shown in FIG. 8. During the fabrication of color filter layer 58, black masking layer 132 may be patterned on the color filter substrate layer 130 (e.g., using photolithography at step 200). In the active area AA, patterned black masking layer structures 132 may form a grid shaped black matrix defining an array of color filter element openings. In the inactive area IA, black masking layer structures formed from layer 132 may form a black border layer that serves as a light blocking structure. An opening 250 may also be formed in the opaque CF BM layer 132.

At step 202, color filter elements such as red color filter elements, blue color filter elements, green color filter elements, cyan color filter elements, magenta color filter elements, yellow color filter elements, clear color filter elements, and other suitable color filter elements may be formed in the openings of the color tilter black matrix. At step 204, sealant 136 or other adhesive material may be dispensed within opening 250 of layer 132 on the color filter substrate 130.

During the fabrication of thin-film transistor layer 56, black masking layer 102 may be patterned on the lower surface of thin-film transistor layer substrate 100 (e.g., using photolithography at step 206). In active area AA, patterned black masking layer structures 102 may form a grid shaped black matrix defining an array of display pixel openings 104. In inactive area IA, black masking layer structures formed from layer 102 may form a black border layer that serves as a light blocking structure. Spin-on glass planarization layer 106 may then be deposited on top of layer 102 to planarize layer 102 (e.g., by spinning on layer 106 using spin deposition techniques or using other suitable deposition techniques such as spraying techniques). In general, any suitable polymer, glass, or other clear material may be used in forming planarization layer 106. An advantage of using silicate based spin-on glass materials is that this type of material is compatible with dry etch processes used in patterning metal traces in thin-film transistor circuitry layer 108.

At step 208, thin-film transistor structures and associated routing structures in TFT circuitry layer 108 may be formed over planarization layer 206. For example, power routing lines for carrying a common power supply voltage Vcom, clock routing lines for carrying gate driver clock signals, thin-film transistors that form part of gate driver circuitry, and other control routing lines may be formed in layer 108 in inactive region IA. At step 210, liquid crystal material 52 may be dispensed on layer 108.

At step 212, the TFT layer 56 and the CF layer 58 may be assembled together (e.g., so that liquid crystal material 52 is sandwiched between layers 56 and 58 and so that sealant 136 is interposed between layers 108 and the color filter substrate 130).

Figure 9:
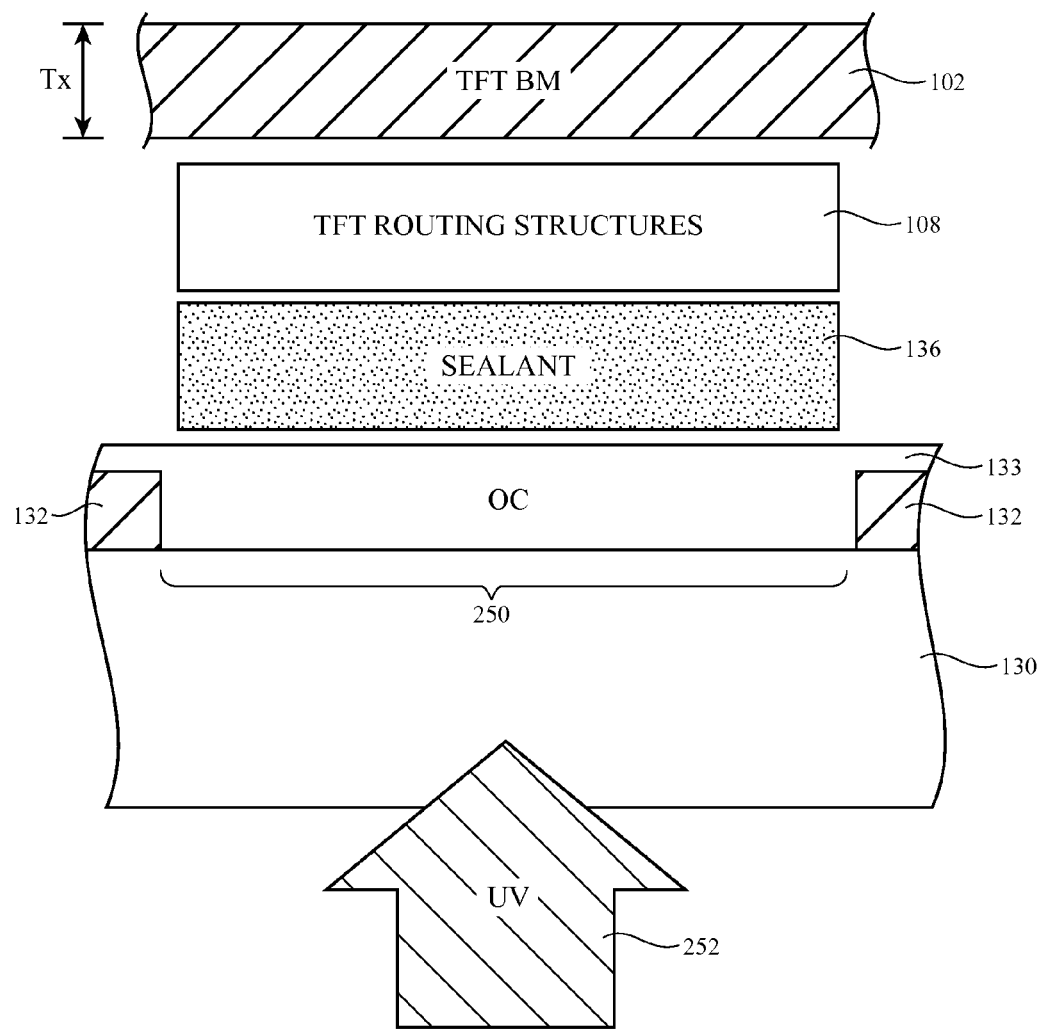
FIG. 9 is a cross-sectional side view showing show a display sealant can be cured using UV light in accordance with an embodiment.

At step 214, curing light such as ultraviolet (UV) curing light, blue curing light, light emitting diodes (LED) curing light, tungsten curing light, halogen curing light, fluorescent curing light, plasma arc curing light, a combination of these lights, and/or other types of light suitable for hardening adhesives may be used to cure sealant 136 (see, e.g., FIG. 9). As shown in FIG. 9, opening 250 in layer 132 may be necessary to allow UV light 252 to reach the embedded sealant 136 and to cure sealant 136. If sealant opening 250 were not present (i.e., if the color filter black masking layer 132 were to completely block off sealant 136 from receiving light from underneath). UV light 252 would not be able to properly cure sealant 136 as desired. Sealant opening 250 may therefore sometimes be referred to as a sealant light curing opening. Sealant 136 cured in this way may therefore sometimes be referred to as a light-cured adhesive, a light-curable adhesive, or a light-sensitive adhesive material.

Curing sealant 136 with light may only partially harden sealant 136. In the example of FIG. 9, a clear overcoat layer such as overcoat layer 133 may be formed over color filter black masking material 132 (e.g., sealant 136 may be dispensed over the overcoat layer). Clear overcoat layer 133 need not be used.

At step 216, sealant 136 may be subject to elevated temperatures (e.g., temperatures of 100° C. or higher or other suitable elevated temperatures) to thermally cure sealant 136. Curing sealant 136 with heat may completely harden sealant 136. Sealant 136 cured in this way may therefore also sometimes be referred to as a thermally-cured adhesive or a heat-sensitive adhesive material. The curing of sealant 136 may therefore be a two-step curing process, as described in steps 214 and 216.

Thereafter, polarizing layers 54 and 60, backlight unit 42, and other display circuitry may be assembled within device 10. When device assembly operations are completed, device 10 may be used to display images for a user.

Figure 10:
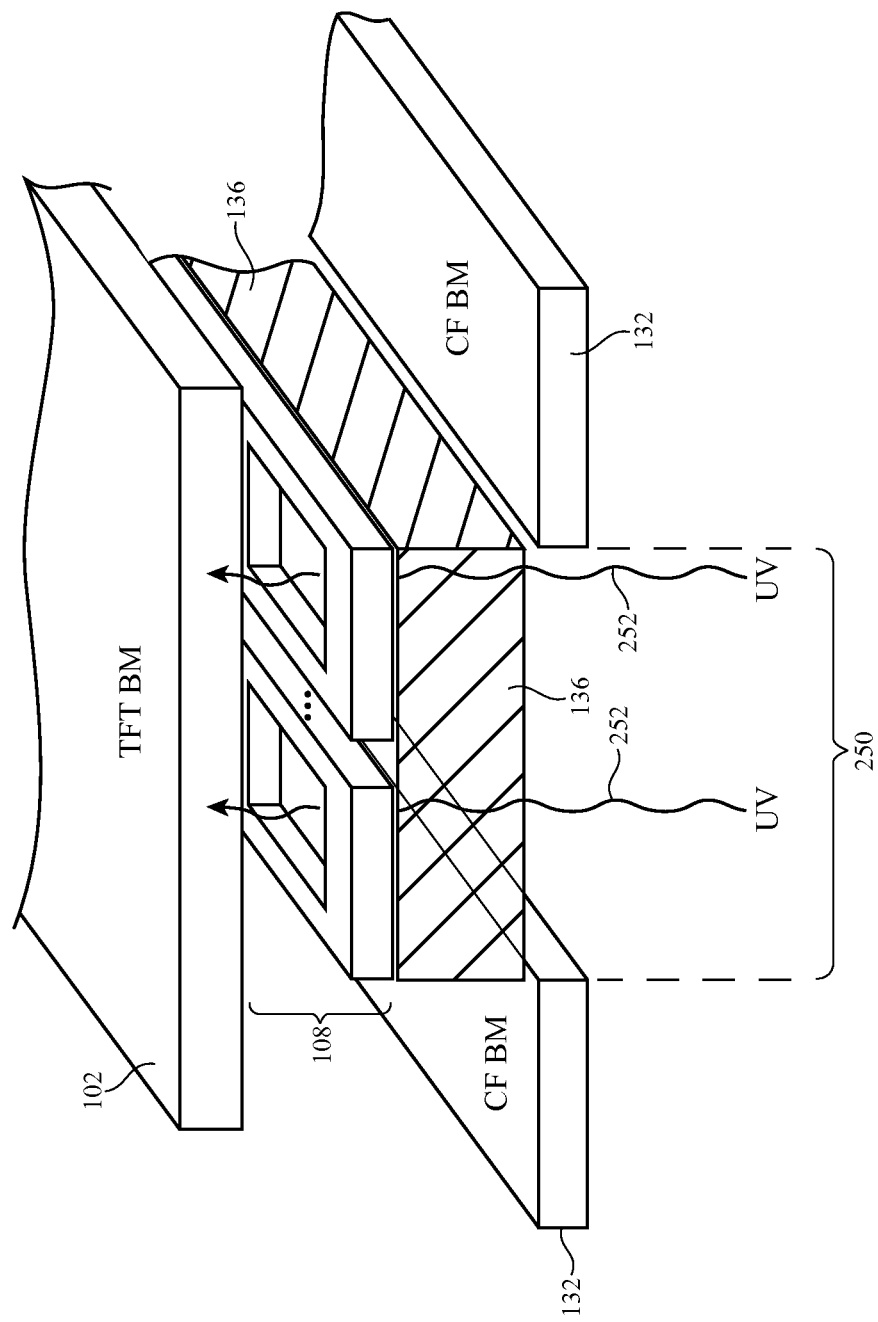
FIG. 10 is a perspective view showing how the UV light of FIG. 10 can reach the TFT black matrix layer in accordance with an embodiment.

FIG. 10 shows one suitable arrangement of display 14 where TFT routing structures in layer 108 are formed in a mesh-like configuration. The TFT routing structures in layer 108 may serve as Vcom routing paths, gate driver signal routing paths, clock signal routing paths, and other data/control signal routing paths for circuitry in thin-film transistor layer 56. Sealant material 136 is formed in opening 250 between layer 108 and the plane on which the color filter black masking layer 132 is formed. As shown in FIG. 10, the TFT routing structures may be arranged in a grid-like pattern and may have holes through which light 252 (e.g., UV light for curing sealant 136 dispensed within opening 250) can penetrate. This may not be an issue during manufacturing operations. However, during normal user operation, any stray light in the inactive area IA can travel through opening 250 and penetrate through the holes in the TFT routing structures in layer 108 to reach TFT BM layer 102.

One way to prevent backlight from leaking into TFT black masking layer 102 through opening 250 and layer 108 is via the use of black tape 138, as described in connection with FIG. 7. Black tape 138 should overlap with opening 250 in CF black masking layer 132 and can prevent stray light emitted from unit 42 from propagating through opening 250. In certain scenarios, it may not be desirable or possible to form black tape 138 on the backside of the color filter substrate 130. In such scenarios, the thickness of border masking layer 102 may have to be increased to boost the opacity of layer 102.

Figure 11:
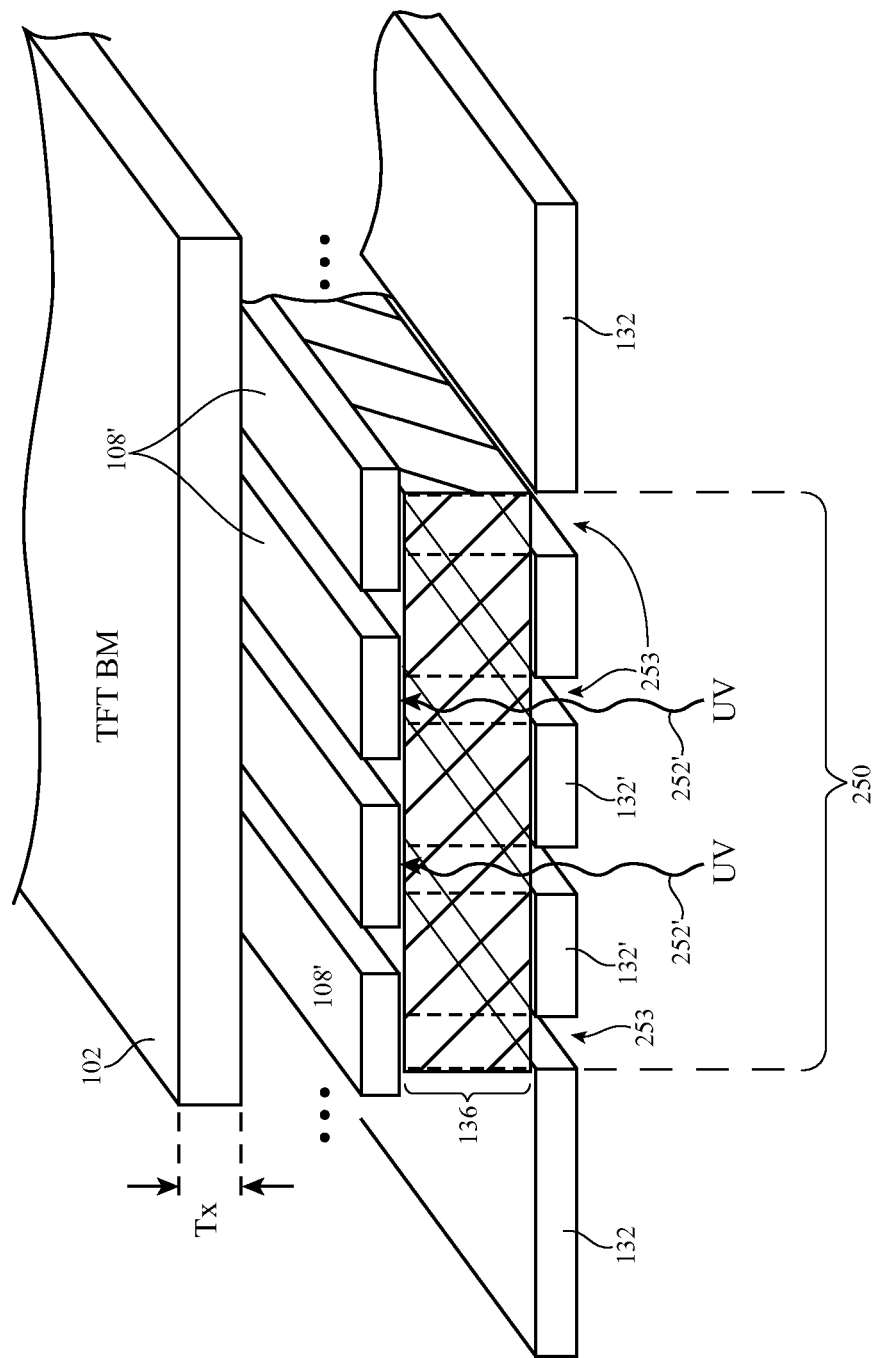
FIG. 11 is a perspective view showing how the UV light of FIG. 10 is blocked by TFT routing structures in accordance with an embodiment.

In another suitable arrangement, additional light blocking structures such as black masking material 132' may be formed within sealant opening 250 (see, e.g., FIG. 11). As shown in FIG. 11, multiple strips of black masking material 132' may be formed within opening 250. The black masking strips 132' should be formed such that curing light (e.g., UV light 252') can still travel through gaps 253 between each adjacent strip 132'. These gaps or "reduced openings" 253 serve to allow the curing light to penetrate and cure sealant 136. There may be at least two gaps, at least three gaps, at least ten gaps, at least a hundred gaps, or any suitable number of gaps in the color filter black masking layer that allow light to cure sealant 136 during the manufacturing process. Sealant material 136 may be formed at opening 250 between layer 108 and color filter black masking layer 132.

In order to prevent stray light from reaching TFT black masking layer 102, the TFT routing circuitry in layer 108 may be restructured such that the TFT routing structures 108' at least overlap and completely cover each of gaps 253 in sealant light curing opening 250. In particular, each individual routing member 108' should not have holes and/or openings that will allow light traveling through gaps 253 to reach black masking layer 102 (e.g., each metal routing path 108' formed directly over the gap portions 253 should be a solid opaque conductive member that will reflect or absorb light coming from backlight unit 42). If desired, anti-reflective coating (ARC) material may be formed on the underside of routing structures 108' to prevent light from being reflected back towards black masking layer 132 in unpredictable ways.

As shown in FIG. 11, TFT routing structures 108' may serve as light blocking members and may have edges that extend beyond the gap edges to ensure adequate coverage. Configured in this way, the thickness of TFT black masking layer 102 can be minimized without the use of black tape 138 (i.e., black tape 138 need not be used). Black tape 138 may not be required in this scenario because the TFT routing structures 108' have been configured to block any stray light traveling through gaps in sealant opening 250. The example of FIG. 11 in which the additional black masking portions 132' formed within opening 250 are elongated strips is merely illustrative and do not limit the scope of the present invention. If desired, the additional black masking portions 132' formed within opening 250 may form a grid-like structure with an array of holes or may be configured in any suitable way as long as at least some curing light is able to reach sealant material 136. Depending on the arrangement of the additional black masking portions 132', the TFT structures 108' lying directly over the region in which sealant material 136 is formed should be configured such that a solid piece of metal is completely covering each corresponding hole/gap in black masking layer 132 at least within opening region 250.

During operation of device 10, backlight structures 42 may produce backlight 44 (FIG. 7). In active area AA, backlight 44 is allowed to pass through color filter elements 134 on color filter layer 58 and associated openings 104 in the black matrix formed in the thin-film transistor layer 56. In inactive area IA, stray backlight from backlight structures 42 is blocked by stray light blocking structures that include at least two stray light blocking layers. The innermost light blocking layer is formed from the border portion of black masking layer 132 on the upper surface of color filing layer substrate 130. The outermost light blocking layer is formed from the border portion of black masking layer 102 on the lower surface of thin-film transistor layer substrate 100. Layer 108 (e.g., solid metal routing members 108' in FIG. 11) may also block some stray light traveling through sealant light curing gaps 253 in inactive area IA. Because the TFT routing circuitry 108' helps to block stray light, it is possible to form light blocking layer 102 from a thinner layer of black masking material than would otherwise be possible, ensuring that the black masking layer 102 and associated planarization layer 106 are not too thick.

The foregoing is merely illustrative and various modifications can be made by those skilled in the art without departing from the scope and spirit of the described embodiments. The foregoing embodiments may be implemented individually or in any combination.

What is claimed is:
1. A display, comprising:
   a color filter layer having a color filter black masking layer;
   a thin-film transistor layer that comprises a thin-film transistor black masking layer and conductive structures that prevent light traveling through gaps in the color filter black masking layer from reaching the thin-film transistor black masking layer, wherein the conductive structures are interposed between the color filter layer and the thin-film transistor black masking layer; and adhesive material interposed between the color filter layer and the thin-film transistor layer, wherein the adhesive material is formed directly over the gaps in the color filter black masking layer.

2. The display defined in claim 1, further comprising:
a backlight unit, wherein the color filter layer is interposed between the backlight unit and the thin-film transistor layer.

3. The display defined in claim 1, wherein the adhesive material comprises light-cured adhesive material.

4. The display defined in claim 1, wherein the conductive structures comprise a plurality of opaque metal routing paths each of which completely covers a respective gap in the color filter black masking layer.

5. The display defined in claim 1, wherein the thin-film transistor layer further comprises:
a transparent substrate on which the thin-film transistor black masking layer is formed; and
a planarization layer formed over the thin-film transistor black masking layer, wherein the planarization layer is interposed between the transparent substrate and the conductive structures.

6. The display defined in claim 1, further comprising:
liquid crystal material interposed between the color filter layer and the thin-film transistor layer.

7. The display defined in claim 6, further comprising:
a ring of light-sensitive adhesive material that seals the liquid crystal material within the display.

8. A display having a periphery, comprising:
a thin-film transistor layer;
a color filter layer having a color filter border masking layer; and
a ring of adhesive material that runs along the periphery of the display, wherein the ring of adhesive material is formed over a region on the color filter layer having at least two gaps in the color filter border masking layer.

9. The display defined in claim 8, wherein region on which the ring of adhesive material is formed has at least three gaps in the color filter border making layer.

10. The display defined in claim 8, wherein the ring of adhesive material is formed from light curable material.

11. The display defined in claim 8, wherein the thin-film transistor layer comprises:
a clear substrate;
a thin-film transistor border masking layer formed on the clear substrate; and
a planarization layer formed over the thin-film transistor border masking layer.

12. The display defined in claim 11, wherein the thin-film transistor layer further comprises:
thin-film transistor routing structures formed over the planarization layer, wherein the thin-film transistor routing structures serve to prevent light penetrating through the gaps in the color filter border masking layer from reaching the thin-film transistor border masking layer.

13. The display defined in claim 12, wherein each of the gaps in the color filter border masking layer has defined edges, and wherein each of the thin-film transistor routing structures has edges that extend beyond the edges of a respective gap in the color filter border masking layer such that the thin-film transistor routing structures completely overlap with the gaps.

14. The display defined in claim 8, further comprising:
a backlight unit, wherein the color filter layer is interposed between the backlight unit and the thin-film transistor layer.

15. A method of manufacturing a display, comprising:
dispensing a ring of sealant on a color filter layer, wherein the color filter layer includes a color filter black masking layer;
assembling the color filter layer to a thin-film transistor layer;
curing the ring of sealant by emitting light that is received by the ring of sealant through at least a plurality of gaps in the color filter black masking layer.

16. The method defined in claim 15, further comprising:
assembling a backlight unit to the color filter layer, wherein the color filter layer is interposed between the backlight unit and the thin-film transistor layer.

17. The method defined in claim 16, further comprising:
forming a thin-film transistor black masking layer in the thin-film transistor layer; and
forming conductive light blocking structures in the thin-film transistor layer that blocks stray light emitted from the backlight unit travelling through the plurality of gaps in the color filter blacking masking layer from reaching the thin-film transistor black masking layer.

18. The method defined in claim 15, further comprising:
dispensing liquid crystal material on the thin-film transistor layer.

19. The method defined in claim 15, further comprising:
performing thermal curing on the ring of sealant after curing the ring of sealant with light.

* * * * *